Figure 1:
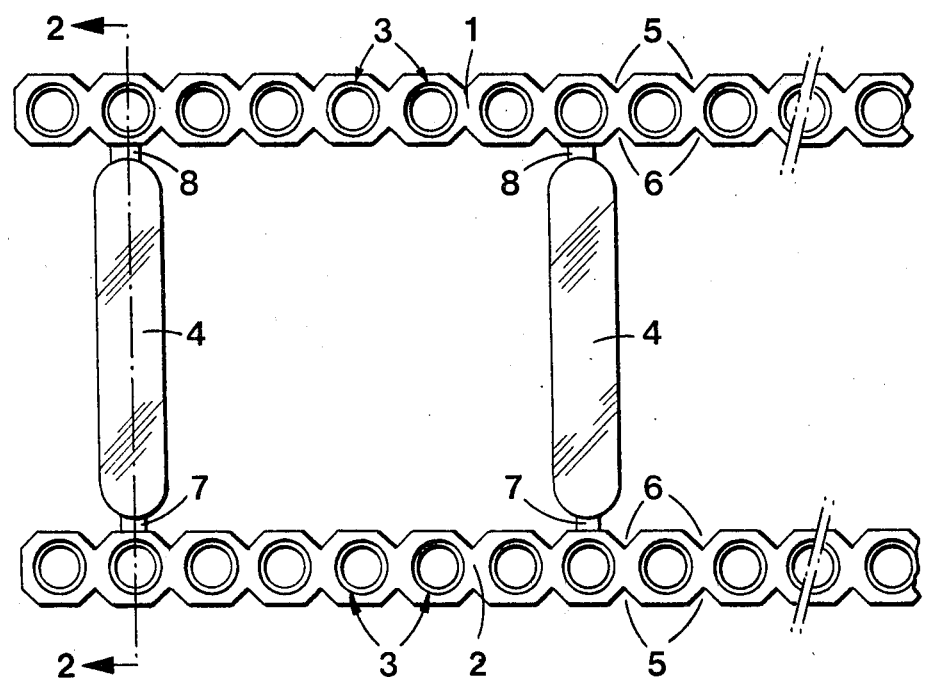

United States Patent [19]

Birnholz

[11] 4,422,708

[45] Dec. 27, 1983

[54] SUPPORT DEVICE FOR INTEGRATED CIRCUIT

[75] Inventor: Jean Birnholz, Monthey, Switzerland

[73] Assignee: Ultra-precision, S.A., Monthey, Switzerland

[21] Appl. No.: 251,203

[22] Filed: Apr. 6, 1981

[30] Foreign Application Priority Data

Jun. 13, 1980 [CH] Switzerland ............... 4575/80

[51] Int. Cl.³ ..................................... H01R 13/514
[52] U.S. Cl. ..................... 339/176 MP; 339/66 T; 206/329; 206/820
[58] Field of Search .......... 339/176 R, 176 MP, 66 T; 206/820, 329, 347

[56] References Cited

U.S. PATENT DOCUMENTS

| | | | |
|---|---|---|---|
| 3,184,536 | 5/1965 | Vincent | 339/66 T |
| 3,216,089 | 11/1965 | Dettman | 206/820 X |
| 3,440,027 | 4/1969 | Hugle | 206/820 X |
| 3,512,116 | 5/1970 | Miwa et al. | 339/66 T |
| 3,731,254 | 5/1973 | Key | 206/820 X |
| 3,899,074 | 8/1975 | Lucas | 206/820 X |
| 4,044,888 | 8/1977 | Schachter | 206/820 X |
| 4,106,619 | 8/1978 | Haytayan | 206/820 X |

*Primary Examiner*—Willie G. Abercrombie
*Attorney, Agent, or Firm*—Eugene E. Geoffrey, Jr.

[57] ABSTRACT

The device is formed of a mono-block piece comprised, on one hand, of two parallel parts (1, 2) presenting holes (3) where are arranged the sockets intended to cooperate with the pins of the integrated circuit block. It is comprised, on the other hand, of bridges (4) rigidly connecting these two parallel parts (1, 2). Thus, there is provided a perfect coincidence or register of the two series of pins of the integrated circuit and the two series of sockets, during the setting in place of the circuit on the support device.

4 Claims, 2 Drawing Figures

SUPPORT DEVICE FOR INTEGRATED CIRCUIT

In the manufacturing in series of electronic devices, the integrated circuits most often used are formed with a block which is comprised of parallel sections, for example 4, 8, 10 or 12, each of those sections being provided at each of their extremities with a pin. These pins form therefore two parallel rows which are intended to be engaged into sockets provided into two support devices. These support devices are each comprised of a sort of ruler drilled with holes wherein the sockets are arranged. However, a difficulty arises due to the fact that the two ruler-shaped supports must be arranged one with respect to the other with extreme precision so that the pins of the integrated circuit engage and penetrate very precisely in the sockets of the supports, if not the pins are damaged upon inserting the pins into the sockets. These rulers must therefore be strictly parallel, on the same level one with respect to the other and the sockets of one of the rulers must be exactly facing the sockets of the other ruler. All these setting in place operations of the integrated circuit and subsequent welding of the pins in the sockets being carried out on machines, according to conventional processes, there is substantial waste due to the damaging of the pins. The present invention aims at providing a remedy to this short-coming and it is an object of this invention to provide a support device for an integrated circuit formed with a block comprised of parallel sections provided at each of the ends with a pin, this pin forming thus two rows which are intended to be engaged into corresponding sockets of the support device. The device according to the invention is different from the known devices in that it is formed by a mono-block piece comprised, on one hand, of two parallel portions where are arranged the sockets intended to cooperate with the pins of the integrated circuit block and, on the other hand, of bridges rigidly connecting these two parallel portions, hence providing for a perfect register of the two series of pins of the integrated circuit and of sockets, upon setting in place the circuit on the support device.

The annexed drawing shows by way of example a form of execution of the support device according to the invention.

Figure 2:
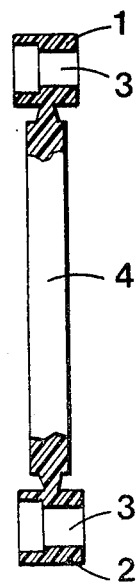

IN THE DRAWINGS:

FIG. 1 is a plane view and FIG. 2 is a cross-section view according to 2—2 of FIG. 1.

The device represented is formed of a mono-block piece comprised of two parallel portions 1, 2 wherein are drilled holes 3 intended to receive, as it is known, sockets wherein are engaged pins of the integrated circuit intended to be fixed on said support. The device further comprises bridges 4 rigidly connecting the two portions 1 and 2 so that they are exactly held in the correct position one with respect to the other.

Thereby, the machine-assembly of the integrated circuit on the device may be effected without any problem, as well as the welding of the pins into the sockets, according to the known process.

The integrated circuits are, as it has been mentioned earlier, formed in general of 4, 8, 10 or 12 sections for example. To adapt the length of the support to the size of the integrated circuit that is desired to fix on the support, there are provided along the parts 1 and 2 notches 5, 6 so as to decrease the cross-section area of the parts 1 and 2 between the locations where the holes 3 are drilled and which are intended to receive the sockets. Hence, the parts 1 and 2 may be easily cut off to make them correspond to the length of the integrated circuit intended to be fitted on the support device. Further, there is provided at each of the ends of the bridges 4, at 7 and 8, a reduction of the cross-section area of these bridges to provide for an easy cut-off at these locations and to remove them once the integrated circuit block is set in place on the device. The possibility to remove the bridges presents the advantage to completely free the space available between the parts 1 and 2, for example to mount other components of the electronic apparatus.

What is claimed is:

1. A support device for an integrated circuit in the form of a block having rows of pins along opposing edges thereof for engagement with corresponding sockets carried by a support device, said support device being adapted to be mounted on a circuit board and comprises a unitary structure having two elongated parallel portions formed of insulating material each provided with socket receiving holes spaced to cooperate with the spacing of the pins of the integrated circuit block and a plurality of transverse bridges of insulating material rigidly connecting said two parallel portions to provide a perfect register of the centers of the two series of holes with the pins of the integrated circuit so that the two series of sockets carried by said socket receiving holes will precisely register with the pins of the integrated circuit on the support device.

2. A device according to claim 1, wherein said two parallel portions each have the shape of an elongated narrow element having cross-section reductions between said socket receiving holes to provide for easy cut-off of these elements to the length of the integrated circuit block intended to fit on the device.

3. A device according to claim 2 wherein said bridges are each aligned with the center of the holes on opposing elongated portions and each have reduced cross-sections adjoining the ends thereof to provide for easy cut-off at these locations for the removal thereof after the device is secured to said board.

4. A device according to claim 2 wherein each of said holes has a portion of enlarged diameter on one end thereof to coordinate with the configuration of the sockets.

* * * * *